United States Patent [19]
Cordaro

[11] 3,983,545
[45] Sept. 28, 1976

[54] RANDOM ACCESS MEMORY EMPLOYING SINGLE ENDED SENSE LATCH FOR ONE DEVICE CELL

[75] Inventor: William Cordaro, Wappingers Falls, N.Y.

[73] Assignee: International Business Machines Corporation, Armonk, N.Y.

[22] Filed: June 30, 1975

[21] Appl. No.: 591,988

[52] U.S. Cl. ........................... 340/173 FF; 307/238; 307/279
[51] Int. Cl.² ................. G11C 11/40; H03K 3/281
[58] Field of Search.. 340/173 NR, 173 R, 173 AM, 340/173 FF, 173 RC, 173 SP; 307/238, 283

Primary Examiner—Thomas A. Robinson
Attorney, Agent, or Firm—Wesley DeBruin

[57] ABSTRACT

A monolithic random access memory having a plurality of groups of storage cells, each storage cell of each group being adapted to store an electrical manifestation of a binary 1, or an electrical manifestation of a binary 0, a sense latch for each of said groups of storage cells for controllably sensing the binary value 0 or 1 stored in any one of said storage cells included within the group of storage cells with which said sense latch is associated, each of said sense latches comprising: a first field effect transistor directly connected to each cell of a group of said storage cells, second, third, fourth and fifth field effect transistors respectively connected to said first field transistor and to each of the other ones of said second, third, fourth and fifth field effect transistors, means for controlling the conductivity of said first, second, third, fourth and fifth transistors on a selective basis, whereby a binary 1 or a binary 0 may be read from and restored to any predetermined cell in each group.

12 Claims, 6 Drawing Figures

READING AND RESTORING
A "1" IN CELL MC11

RANDOM ACCESS MEMORY EMPLOYING SINGLE ENDED SENSE LATCH FOR ONE DEVICE CELL

CROSS REFERENCE TO RELATED APPLICATIONS

Reference is made to U.S. patent application Ser. No. 565,326, entitled "Multiplication Mode Bistable Field Effect Transistor and Memory Utilizing Same" filed Apr. 7, 1975 by H. W. Curtis and R. L. Verkuil and of common assignee herewith.

Reference is made to U.S. patent application Ser. No. 591,989, entitled "Random Access Memory Read/Write Buffer Circuits Incorporating Complementary Field Effect Transistors", filed June 30, 1975 by William Cordaro, and of common assignee herewith.

BACKGROUND OF THE INVENTION AND PRIOR ART

Field Effect Transistor technology is a relatively highly developed art, which is currently under extensive development and investigation by the art in general. There are a sizeable number of published articles, patents and text books directed to theory, structure, methods of fabrication, process technology, circuitry and application of field effect devices.

MOSFETs (Metal-Oxide Silicon Field Effect Transistors), MISFETs (Metal Insulator Silicon Field Effect Transistors) and IGFETs (Insulated Gate Field Effect Transistors) are terms extensively employed in the art and possessing well established definitions in the art. "N-channel", "P-channel", "Enhancement Mode", "Depletion Mode" and "CMOS" (Complementary Metal Oxide Silicon) are additional terms extensively employed in the art and possessing well established definitions. At least certain of the foregoing terms will be used hereinafter. When used hereinafter, their use will be in full accord with the generally established definition given said phrase or word in the art.

Numerous texts fully explain the theory of operation of field effect transistors. Two such texts are: (1) "MOSFET in Circuit Design" by Robert H. Crawford (Texas Instrument Series) McGraw Hill, copyright 1967 by Texas Instruments Incorporated and (2) "ELECTRONICS: BJTs, FETs and Microcircuits" by E. James Angelo, Jr., McGraw Hill Electrical and Electronic Engineering Series, copyrighted 1969 by McGraw Hill.

A publication tracing the development of the field effect transistor, evidencing its high state of development, and explaining in non-mathematical terms its operation is the following article: "Metal-Oxide Semiconductor Technology" by William C. Hittinger, Scientific American, August 1973, pages 48 through 57.

U.S. Pat. No. 3,588,846 granted June 28, 1971 to Richard H. Linton is directed to a "Storage Cell With Variable Power Level". The storage cell has two cross coupled FET's which function as the storage element of the cell. The cross coupled FET's are address powered through input/output FET's when the cell is interrogated for reading. When the cell is not being so interrogated, the cross coupled FET's are supplied power from a source which is connected to each of the cross coupled FET's by a separate load FET. The gates of those load FET's are biased so the load FET's supply charge to the cross coupled FET's while the storage cell is not being interrogated but draw charge from the cross coupled FET's when the cross coupled FET's are addressed for reading. By biasing the load FET's in this manner, the potential on the drain can be reduced so as to reduce the overall power dissipation of the storage cell.

U.S. Pat. No. 3,593,037 granted July 13, 1971 to Marcian E. Hoff, Jr. is directed to "Cell For MOS Random-Access Integrated Circuit Memory." The cell is a dynamic storage device which utilizes the parasitic capacitance associated with the lead and gate of an MOS device for storage. The cell is adaptable for use in a memory which has a separate select-write line, select-read line, write data line and read data line.

U.S. Pat. No. 3,683,206 granted Aug. 8, 1972 to Tegze Haraszti is directed to an electrical storage element comprising two controllable elements, such as field effect transistors, controllable into conducting or cut off positions in phase opposition and in dependence on the state of charge of storage capacitances.

Reference is made to U.S. Pat. No. 3,740,732 granted June 19, 1973 to Pierre M. Frandon and directed to a "Dynamic Data Storage Cell". The dynamic data storage cell disclosed in U.S. Pat. No. 3,740,732 requires only one insulated field effect transistor to store binary data. The drain of the FET is connected to a data input line and data is stored at the source node of the transistor by inherent capacitance between the source diffusion and the substrate. The capacitance of the source electrode is enhanced by forming a heavily doped layer to underlie a portion of the source diffusion. Using the substrate as circuit ground enables the fabrication of an array of transistors for a random access memory wherein the surface area of the semiconductor chip is minimized.

U.S. Pat. No. 3,745,539 granted July 10, 1973 to Evan E. Davidson et al is directed to a semiconductor device circuit for reading an FET capacitor store dynamic memory cell and for regenerating the charge (if any) in said capacitor whereby non-destructive readout is achieved. The memory cell includes an FET switch for selectively connecting the storage capacitor to a memory array bit-sense line through either one of a pair of oppositely connected bi-polar transistors for reading and writing, respectively. The bit sense line is connected to the input terminal of a latching regenerative feedback amplifier such as a silicon controlled rectifier. The potential level at said input terminal rises to a relatively higher level by regenerative feedback action in response to a relatively lower bit-sensing voltage which initiates the latching action. The storage capacitor of the memory cell is recharged via one of the bipolar transistors in response to the aforesaid relatively higher potential at the amplifier input terminal. Bipolar current switch embodiments as well as a silicon controlled rectifier embodiment are disclosed for implementing the latching regenerative feedback amplifier.

U.S. Pat. No. 3,748,498 granted July 24, 1973 to Kurt Hoffman is directed to a quasi-static flip-flop circuit wherein a pair of cross-connected transistors are connected between a power source ($V_{DD}$) and ground. Each latch transistor is connected to a load device through a node or junction which is also connected to a capacitor. Between each capacitor and its junction are a pair of resistor elements such as depletion mode MOS devices.

U.S. Pat. No. 3,774,176 granted Nov. 20, 1973 to Karl-Ulrich Stein et al is directed to a "Semiconductor Memory Having Single Transistor Storage Elements and a Flip-Flop circuit for the Evaluation and Regeneration of Information". More specifically, U.S. Pat. No. 3,774,176 discloses a dynamic semiconductor memory having a plurality of single transistor storage elements connected to a digit line and respective selection lines, an evaluation and regeneration circuit including a flip-flop having a pair of input/output points, each of the points connected to one of the digit lines, and means connecting the points including a controllable semiconductor switch operable to place the points at equal potentials prior to reading from a selected storage element.

The IBM Technical Disclosure Bulletin publication entitled "Read-Only Storage Bit Precharge/Sense Circuit" by William Cordaro, Vol. 17, No. 4, Sept. 1974, page 1044 describes a read-only storage (ROS) sense circuit which is fabricated from N-channel and P-channel field effect transistors and supplies its own precharge current.

The IBM Technical Disclosure Bulletin publication entitled "Complementary FET Differential Amplifier" by William Cordaro, Vol. 16, No. 10, Mar. 1974, page 3227 describes a differential amplifier which is fabricated from N-channel and P-channel field effect transistors, the gain of which is determined by the channel lengths and normalized transconductance.

SUMMARY OF THE INVENTION

A dynamic random access memory is fabricated on a monolithic chip of semiconductor material. The memory has an array of memory cells which for convenience of explanation may be considered to be arranged in an array of $n$ columns by $m$ rows. $n$ word lines are provided. Each word line is coupled to the memory cells of a discrete one of said $n$ columns of said $n \times m$ memory array. $m$ bit sense lines are provided. Each sense line is coupled to the memory cells of a discrete one of said $m$ rows of said $n \times m$ memory array. Each memory cell consists essentially of a P-channel enhancement mode field effect transistor whose fabrication is adapted to provide an enhancement capacitor. The capacitance of the enhancement capacitor is due to surface inversion. Selection means is provided for selecting any one of said $n$ word lines and any one of said $m$ bit sense lines. Circuit means operative in conjunction with said selection means is provided for writing a first electrical manifestation (representative of a binary 1) or a second electrical manifestation (representative of a binary 0) in the memory cell coupled to the selected word and bit sense lines. By selecting a single word line and a plurality of bit sense lines, a binary word comprised of a plurality of binary bits (1's and/or 0's) may be written into said memory. That is, the memory is word addressable or bit addressable.

Connected to each bit sense line is a preamplifying sense latch. The sense latch has an input node to which the sense line is connected and an output node. The electrical parameters of the preamplifying sense latch are chosen in design and fabrication such that it has a preferred stable state. Namely, the preferred state is the first of two stable states. The latch will set in the preferred state in the absence of a signal, or a signal of relatively small magnitude, being impressed on its input node via its associated bit sense line. The preamplifying sense latch includes circuit means for forcing it into a non-stable state, or high gain state, immediately prior to receipt of an input signal. When the latch is forced into this unstable state, it will rapidly assume, or switch to, its preferred state (first stable state) in the absence of a signal of sufficient magnitude being impressed on its input terminal.

Each memory cell consisting essentially of a P-channel enhancement mode field effect transistor having an enhancement capacitor, upon being addressed for reading the data stored therein, provides a significant signal to the sense latch if a binary 0 is stored therein, and a signal of little or no magnitude if a binary 1 is stored in the memory cell.

The sense latch having been conditioned to respond to the signal on the bit line assumes its preferred state in response to a binary 1 having been read from the memory cell and its second state in response to a binary 0 having been read from the memory cell. When the sense latch is in its preferred, or first state, an electrical manifestation of a binary 1 is provided at its output node. When the sense latch is in its second stable state, an electrical manifestation of a binary 0 is provided at its output node. The output node of each sense latch may be "dotted" or connected via a transmit gate to an output bus.

As will be fully apparent from the detailed description of the preferred embodiment of the invention, set forth hereinafter, each sense latch is employed (1) to write data into the memory (2) to read and restore data from the memory and (3) to refresh data stored in the memory. Each time the sense latch is employed to read data from a cell in the memory it also refreshes the data stored in the cell read.

In accordance with the invention a monolithic memory is fabricated on a chip of semiconductor material. The semiconductor material is preferably silicon. The memory has a plurality of groups of storage cells. Each storage cell of each group is adapted to store an electrical manifestation of a binary 1, or an electrical manifestation of a binary 0. Each cell consists essentially of a P-channel enhancement mode field effect transistor having the inherent ability by virtue of its structure to form an enhancement capacitor. A preamplifying bidirectional sense latch is associated with each group of memory cells. Each sense latch is adapted for utilization in the writing of data, the reading of data, and the refreshing of data stored in said memory.

It is a primary object of the invention to provide an improved Random Access Monolithic memory.

It is a primary object of the invention to provide an improved bidirectional preamplifying sense latch for a Random Access Monolithic memory.

It is an object of the invention to provide an improved bidirectional preamplifying sense latch which is utilized in writing, reading and refreshing data in a Random Access Monolithic memory.

It is an object of the invention to provide an improved Random Access Monolithic memory contained on a single chip of semiconductor material.

It is an object of the invention to provide an improved bidirectional preamplifying sense latch, and an improved memory cell for use in a monolithic memory contained on a single chip of semiconductor material.

It is an object of the invention to provide an improved bidirectional preamplifying latch.

It is an object of the invention to provide an improved monolithic memory chip where the bit storage capacity per sense latch and per chip is materially increased.

It is an object of the invention to provide a memory chip which may be operated from a single low voltage supply.

The foregoing and other objects, features and advantages of the invention will be more apparent from the following more particular description of the preferred embodiments of the invention as illustrated in the accompanying drawings.

BRIEF DESCRIPTION OF THE DRAWINGS

FIGS. 1 and 2, placed together as shown in FIG. 3, depict the circuitry of an $n$ column, $m$ row monolithic memory in accordance with the invention.

FIG. 1 depicts the circuitry of a first row of an $n$ column, $m$ row monolithic memory in accordance with the invention.

DESCRIPTION OF THE PREFERRED EMBODIMENT

Figures 1, 3:
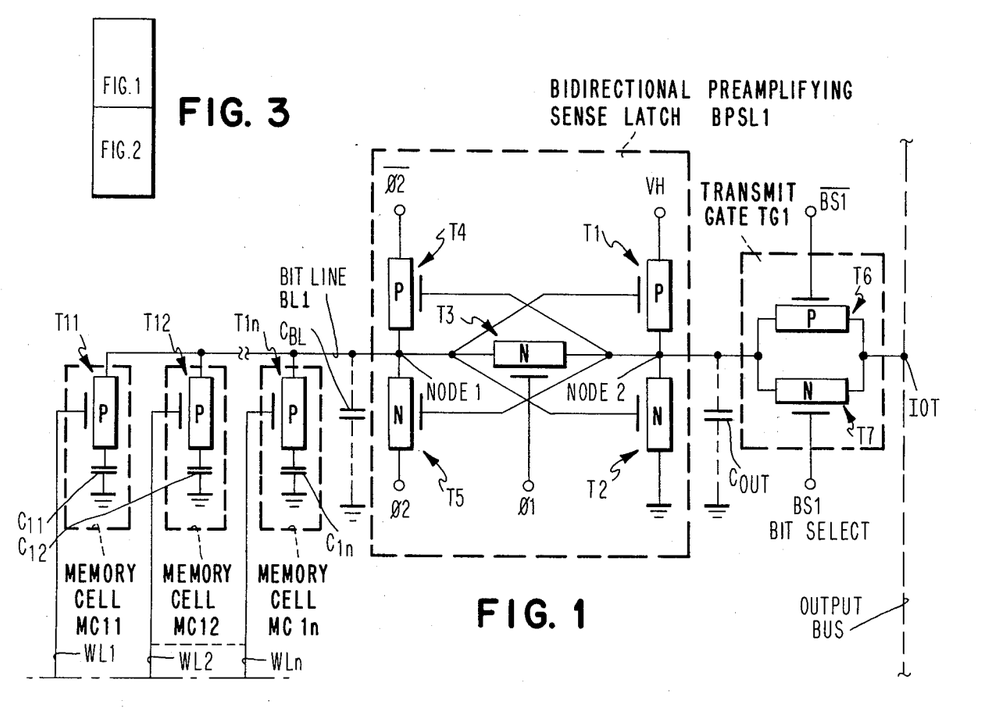
Figure 4:
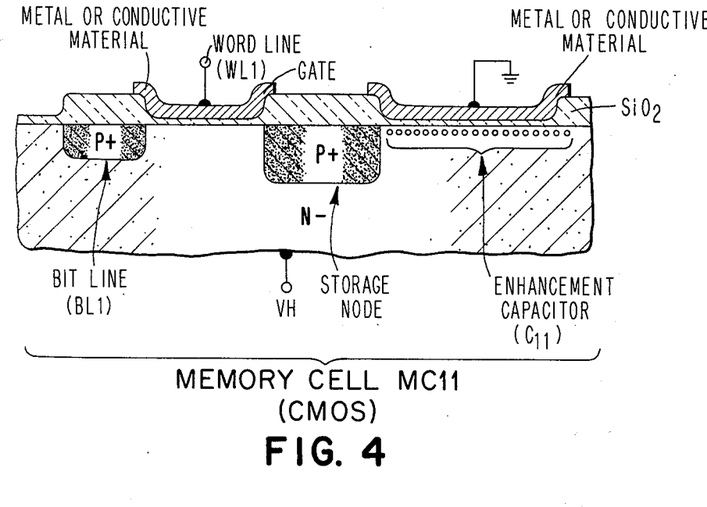
FIG. 4 depicts in cross sectional view a single memory cell of the $n \times m$ memory cells of the monolithic memory in accordance with the invention.

A preferred embodiment of the invention and its operation will now be described with reference to the drawing. Referring to FIG. 1, the circuitry of a first row of a monolithic memory having $m$ rows is depicted. Each row of the memory includes $n$ memory cells. Each memory cell is comprised of a P channel enhancement mode field effect transistor and an enhancement capacitor integrally formed therewith as depicted in FIG. 4. The memory cell as depicted in FIG. 4 is more fully described hereinafter. The enclosed broken line labelled "Memory Cell, MC11" in FIG. 1 is representative of each of the memory cells. It will be noted that the memory cell MC11 includes the P-channel enhancement mode field effect transistor T11 and enhancement capacitor C11. In FIG. 1, three of the $n$ memory cells are shown, namely, MC11, MC12 and MC1$n$. Word lines WL1, WL2 . . . WL$n$ are respectively connected to the gate electrode of the P-channel FET of memory cells MC11, MC12 through MC1$n$. One terminal of each of the P-channel FET's T11 through T1$n$ is connected to the bit line BL1. The second terminal of each of the P channel FET's T11 through T1$n$ is shown connected via its enhancement capacitor to ground potential. The bit line BL1 is connected to node 1 of Bidirectional Preamplifying Sense Latch BPSL1. Node 2 of the Bidirectional Preamplifying Sense Latch is connected to a first terminal of transmit Gate TG1.

A capacitor CBL is shown in dashed lines connected between Node 1 and ground. The dashed lines indicates that no particular structure is added to the monolithic memory chip for the capacitor CBL. The capacitor CBL represents the distributed stray capacitance of the bit line BL1 and memory cells connected thereto. Correspondingly the $C_{out}$ is shown in dashed lines connected between Node 2 and ground. The dashed lines again indicate that no particular structure is added to the monolithic memory chip for the capacitor $C_{out}$. The capacitor $C_{out}$ represents the distributed stray capacitance at the interconnection of Node 2 and the transmit gate TG1. The magnitude of the capacitor CBL is very much greater than the mangitude of $C_{out}$. The magnitude of CBL is also very much greater than the enhancement capacitor (C11 for example) of any one of the memory cells.

Figure 2:
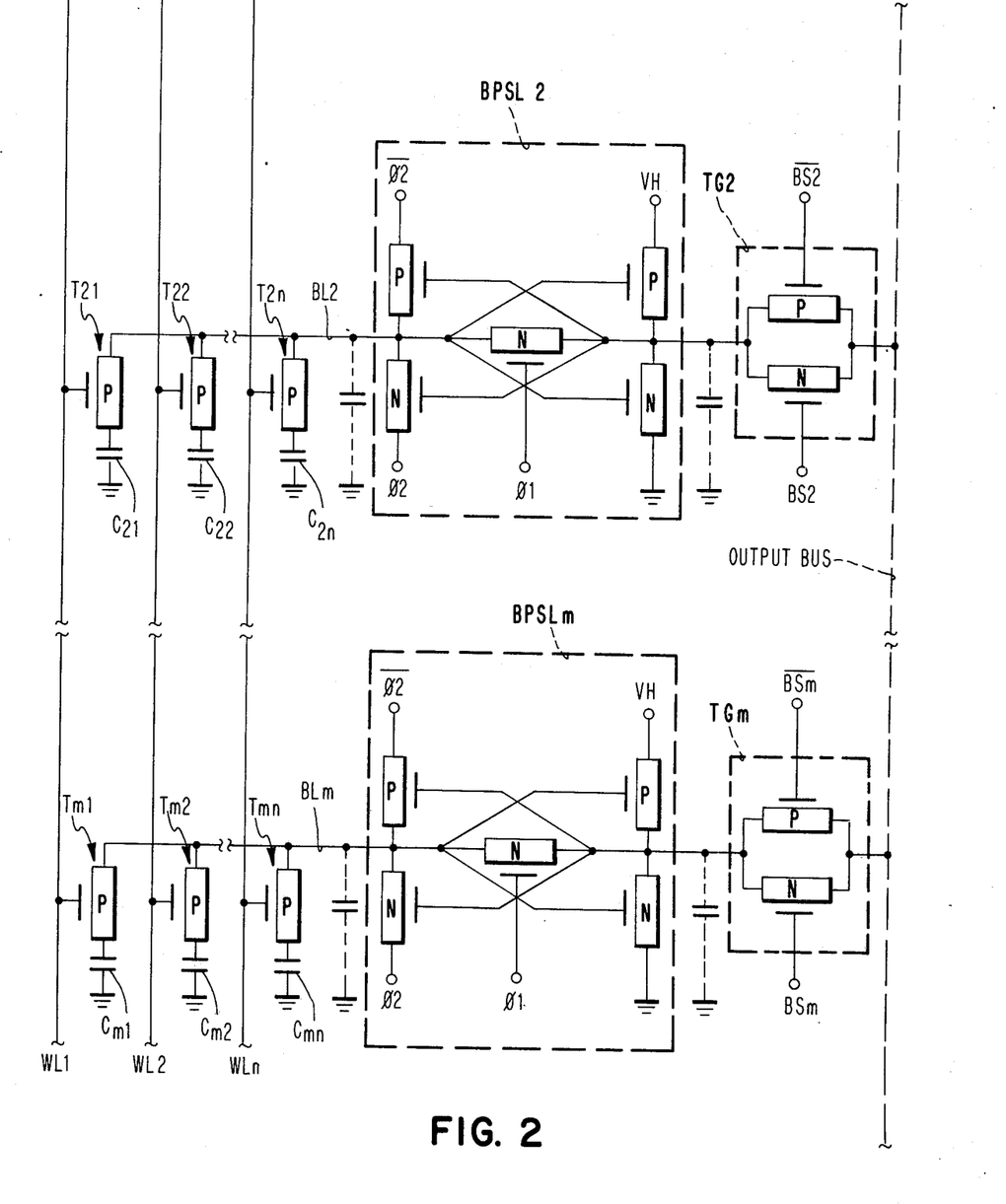
FIG. 2 depicts the circuitry of the second and mth row of the $n$ column, $m$ row monolithic memory in accordance with the invention.

Still referring to FIGS. 1, 2 and 3, each Bidirectional Preamplifying Sense Latch, such as BPSL1, essentially comprises five interconnected enhancement mode field effect transistors, namely, T1, T2, T3, T4 and T5. T1 and T4 are respectively P-channel enhancement mode field effect transistors. T2, T3 and T5 are respectively N-channel enhancement mode field effect transistors. T4 is connected between Node 1 and a controlled variable potential source $\phi 2$. T5 is connected between Node 1 and a controlled variable potential source $\phi 2$. T1 is connected between Node 2 and a potential source VH. T2 is connected between Node 2 and ground potential. T3 is connected between Node 1 and Node 2. The gate of T3 is connected to a controlled variable potential source $\phi 1$. The gate of T1 is connected to Node 1. The gate of T2 is connected to Node 1. The gate of T4 is connected to Node 2. The gate of T5 is connected to Node 2.

Each transmit gate, TG1, TG2 through TGm comprises two interconnected enhancement mode field effect transistors, namely, T6 and T7. T6 is a P-channel enhancement mode field effect transistor. T7 is an N-channel field effect transistor.

From FIGS. 1 and 2 it will be seen that Node 2 of each of the sense latches BPSL1, BPSL2 through BPSLM may be connected via its transmit gate to an Output Bus. The Output Bus is designated by the labelled broken line in FIG. 3. Thus each sense latch may be orthogonally dotted (ORred) to the Output Bus.

Referring to FIG. 4, depicted in cross section is a single representative memory cell of the $n \times m$ memory cell array in accordance with the preferred embodiment of the invention. Solely for convenience of explanation consider the memory cell depicted in FIG. 4 to be memory cell MC11 of FIG. 1. Further, it will be immediately apparent that the structure depicted in FIG. 4 is very similar to a conventional P-channel enhancement mode field effect transistor. One terminal of the storage cell MC11 labelled "Bit Line (BL1" is a P+ semiconductor type region contained within the N− semiconductor substrate. It will be appreciated, particularly by persons skilled in the art, that the P+ type region in FIG. 4 labelled bit line is commonly referred to in the art as a "diffused bit line." In the preferred embodiment, bit line BL1 is an elongated P+ type region common to field effect transistors T11 through T1N (Memory cells MC11 through MC1N) as shown in FIG. 1. The second P type region in the N− type substrate, as depicted in FIG. 4, bears the reference legend "Storage Node". It will be appreciated, particularly by persons skilled in the art, that there is a discrete "storage node" for each memory cell. Further associated with each storage node is a discrete enhancement capacitor. Referring to FIG. 4, the region on the planar surface of the N− substrate extending between the first and second P+ regions namely, between the Bit Line and Storage Node is conventionally termed a channel when capacitively coupled to a metal electrode, or gate electrode. It will further be noted in FIG.

4, that the gate electrode is also labelled "Word Line (WL1)" in accordance with its function in the preferred embodiment. Further, it is to be noted that the N— substrate has a potential of VH impressed thereon.

Still referring to FIG. 4, it will be seen that an enhancement capacitor is depicted to the right of the storage node. The metal or conductive material shown connected to ground may be considered to be the lower plate of capacitor C11 of memory cell MC11 (FIG. 1). The upper plate of capacitor C11 may be considered to be the storage node as depicted in FIG. 4. Th enhancement capacitor is a non-linear capacitor formed by predetermined electrical conditions between the storage node and the metal conductive material connected to ground.

A brief and succinct description of the theory and operation of the enhancement capacitor and the conditions under which it is formed may be found in the following references: 1) Cobbold, Richard S. C.: "Theory and Applications of Field-Effect Transistors", pgs. 230–233, Wiley-Interscience 1970; 2) Richman, Paul: "MOS Field Effect Transistors and Integrated Circuits," pages 47–53, Wiley-Interscience 1973.

To summarize each of the $n \times m$ memory cells of the random access memory in accordance with the preferred embodiment of the invention, essentially comprises a P-channel field effect structure of the type depicted in FIG. 4. N memory cells are associated with each bit line. Each memory cell includes a discrete storage node and structure inherently adapted to form a non-linear capacitor.

The conditions required for writing and reading binary data (ones or zeros) into or from the storage cell of the type depicted in FIG. 4 are succinctly stated as follows:

WRITING:
A BINARY ZERO
1. VH, where VH has a positive magnitude in the order of 4.5 volts, is impressed on the bit line.
2. Word lines (gate) goes to ground potential.
3. Enhancement capacitor is formed and charges to approximately +4.5 volts.

A BINARY ONE
1. Zero, or ground potential is impressed on the bit line.
2. Word line (gate) goes to ground potential.
3. Enhancement capacitor not formed - no charge on enhancement capacitor.

READING:
A BINARY ZERO
1. VH/2, or in the order of +2 volts, impressed on the bit line, via devices T1, T2 and T3.
2. Word line (gate) goes to ground potential.
3. Enhancement capacitor discharges from +4.5 volts, bit line voltage rises.

A BINARY ONE
1. VH/2, or in the order of +2 volts, impressed on the bit line, via devices T1, T2 and T3.
2. Word line (gate) goes to ground
3. Enhancement capacitor not formed (no appreciable charge thereon) bit line voltage does not rise.

It will be appreciated by persons skilled in the art that the specific magnitudes of potentials, capacitors and the like throughout this illustrative preferred embodiment are expressly set forth for convenience of explanation to facilitate a clear, concise and accurate understanding of the principles upon which applicant's invention and its operation are predicted. The specific values and magnitudes set-forth in the preferred embodiment are not to be construed as limiting the scope, practice or teaching of applicant's invention.

Referring to FIG. 1, the capacitance $C_{BL}$ has a magnitude in the order of 3.5 pico farads. The capacitance $C_{BL}$ is related in magnitude to the capacitance $C_{out}$ as follows:

$$C_{BL} \approx 3.5pf \gg C_{out}$$

The capacitance, as stated earlier, of the enhancement capacitor of each memory cell is non-linear, i.e., its capacitance value varies with potential. As depicted in FIGS. 1 and 2 each memory cell has an inherent enhancement capacitor integrally formed in the P-channel memory cell. For the $n \times m$ memory cells of the preferred embodiment of the memory these enhancement capacitors are respectively designated in FIGS. 1 and 2 as $C_{11}, C_{12}, \ldots C_{1n}; C_{21}, C_{22} \ldots C_{2n}; \ldots; C_{m1}, C_{m2} \ldots C_{mn}$. Subject to fabrication tolerances and process variations each memory cell is identical in structure an operation. Also, each enhancement capacitor of each memory cell is identical in structure and operation. Thus, the following description and explanation will make reference solely to memory cell MC11 and enhancement capacitor $C_{11}$. When capacitor $C_{11}$ is charged to approximately +4.5 volts, its capacitance is in the order of 0.39pf, whereas when capacitor $C_{11}$ is charged to approximately +1.45 volts its capacitance is in the order of 0.03pf.

The foregoing relationships may be expanded and summarized for a Random Access Memory Employing Single Ended Sense Latch for One Device Cell in accordance with the preferred embodiment of the invention, as follows:

1. $C_{BL} \approx 3.5pf \gg C_{11}$, $C_{out}$ at $V_{CBLref} \approx 2$ volts, where $V_{CBLref}$ is defined as reference potential of bit line, and the 3.5pf capacitance represents a typical bit line capacitance value for 128 bits on the bit line at a voltage of 2 volts.

2. a. $C_{11} \approx 0.39pf$ at $V_{C11} = 4.5$ volts, where $V_{C11}$ is defined as the voltage on storage node. (4.5V ≠ stored 0)

b. $C_{11} \approx 0.03pf$ at $V_{C11} = |V_{TP}| \approx 1.45$ volts, where $|V_{TP}|$ is defined as threshold voltage of P—channel FET.

3.

$$\Delta V_{BL} \approx \frac{C_{11}}{C_{11} + C_{BL}}(V_{C11} - V_{CBLref})$$

where $\Delta V_{BL}$ is defined as signal present on the bit line when reading the charge storage on $C_{11}$. Typical signals are $\Delta V_{BL} \approx 0.25$ volts when reading 0, and $\Delta V_{BL} \approx 0.005$ volts when reading 1.

4. When the storage node of cell MC11 is at $|V_{TP}| \approx 1.45$ volts the latch (BPSL1) assumes the following state $V_{CBL}$ = ground, and $V_{Cout}$ = VH. The reasons for this are Item 2b and supra.

5. When the storage node of cell MC11 is at VH ≃ 4.5 volts, the latch (BPSL1) is forced to the following state $V_{CBL}$ = VH, and $V_{Cout}$ = ground. The reasons for this are Item 2a and supra.

6. The useful signal in reading 1 = 'Design biases in achieving a Preferred State', this includes both power supply and device tolerances, and the effect of timing skews. NOTE: This signal has a weak dependency on the number of bits on a bit line.

7. The useful signal in reading 0 ≃ |(1−Av) (Δ V$_{BL}$ − noise) | − useful signal in reading 1, where Av is defined as the voltage gain of the preamplifier formed by devices T1 and 2, typical value ≃ 30. NOTE: The gain of this preamplifier is primarily determined by the effective channel lengths of devices T1 and T2. The longer the effective channel lengths the higher the voltage gain. Since the signal on the bit line is a strong function of the number of bits on a bit line, see items 1, 2 and 3, one can visualize that the number of bits on a bit line can be increased readily and still maintain a strong useful signal by controlling the gain of the preamplifier.

Referring to FIGS. 1 and 4, when the storage node of memory cell MC11, for example, has V$_{TP}$ ≃ 1.4 volts stored on the enhancement capacitor, the enhancement capacitor portion of the storage capacitor is not formed. However, leakage current tends to reform the enhancement capacitor by having the storage node go towards VH. In the conventional use of a one device cell this movement of the storage node would reduce the readable signal from a logical 1. However with this present scheme the storage node can have its potential raised to V$_{CBLref}$ and still not have any effect on the useful signal, since the latch has a preferred state. This thereby allows a longer interval between refreshing the memory for the same level of leakage currents.

As stated earlier, the Bidirectional Preamplifying Sense Latches, for example, see BPSL1 FIG. 1, each have two stable states of conductivity, where one of said two states is a preferred state. The preferred state of the Bidirectional Preamplifying Sense Latch allows more signal for binary 0 to be unambiguously read. The bidirectional Preamplifying Sense Latch provides its own reference voltage on the bit line which allows the cell to be read, thus eliminating tracking errors that would occur if a separate reference supply were to be utilized. This self biasing reference voltage also biases devices T1 and T2 in their high gain region. The Bidirectional Preamplifying Sense Latch amplifies the bit line voltage before being set. The Bidirectional Preamplifying Sense Latch allows more bits to be placed on the bit line and facilitates fast access times at low voltages (5 volts) without additional controls. The above recited features and advantages will be more fully apparent from the description and explanation set-forth hereinafter together with the detailed explanation of the operation of the memory and the Bidirectional Preamplifying Sense Latch of this preferred embodiment of the invention.

The foregoing features and advantages are substantially accomplished by satisfying the following conditions and requirements:
1. The latch is designed that when a very small signal or no signal at all is received on the bit line, the latch will set in a preferred state, namely, Node 1 at ground potential and Node 2 at VH potential.

The preferred setting of the latch may be accomplished in any one or combination of several ways, for example:
  a. When the work line is accessed (going low), it couples charge out of the bit line, this disturbance is then amplified by the gain of the preamplifier formed by devices T1 and 2, this will unbalance nodes 1 and 2 prior to the latch being set.
  b. Controlling the timing skew between $\phi 2$ and $\overline{\phi 2}$.
  c. The geometry of the devices (T1, T2, T3, T4 and T5) can be adjusted to favor the latch setting in one direction.
  d. The relationship between the thresholds of device T4 and T5 can be used to advantage if |V$_{TN}$| < |V$_{TP}$|, since device T5 will turn on prior to T4, thus unbalancing Node 1 toward the preferred state.
2. The small signal gain of the amplifier formed by T1 and T2 may be readily controlled by adjusting the effective channel lengths of T1 and T2 (since the voltage gain is directly proportional to the channel length).

Figure 5:
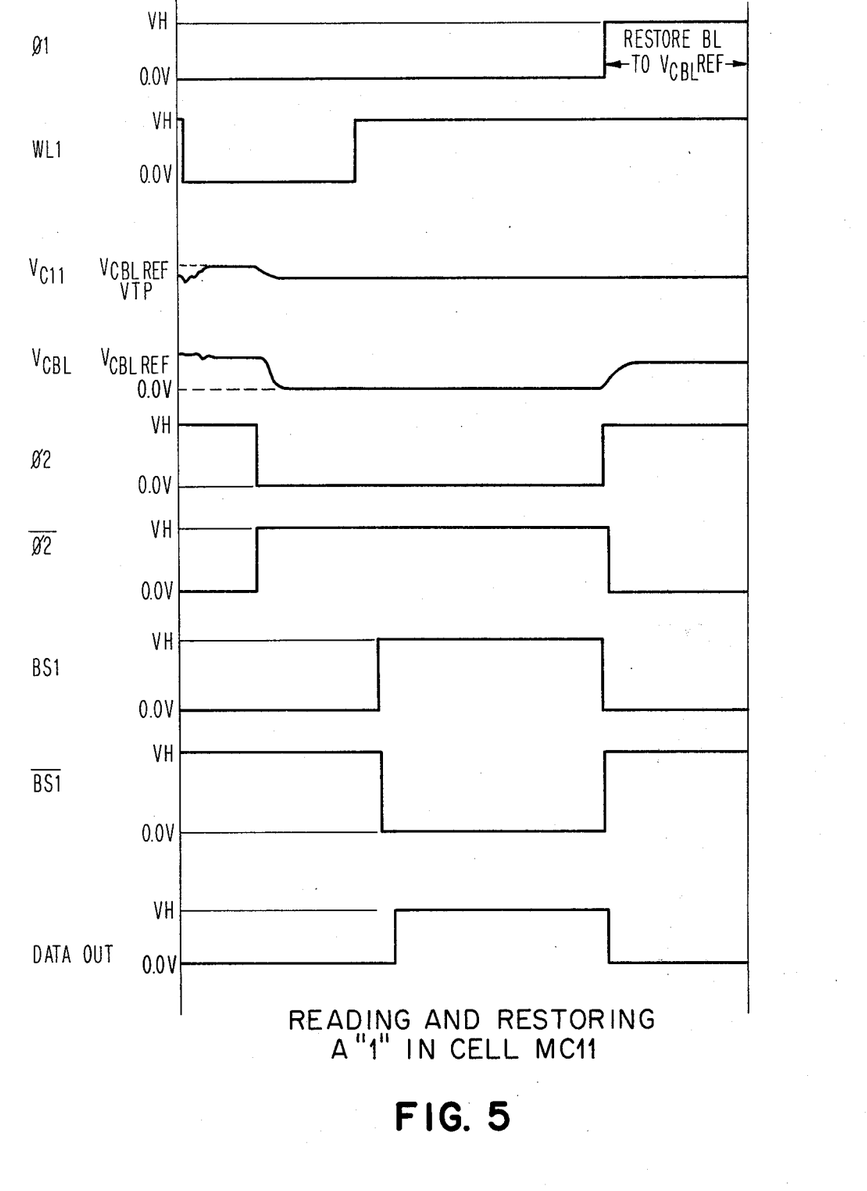
FIG. 5, when viewed in conjunction with FIGS. 1 and 2 placed together as shown in FIG. 3, depicts idealized representative waveforms for reading and restoring a binary 1 in memory cell MC11.
Figure 6:
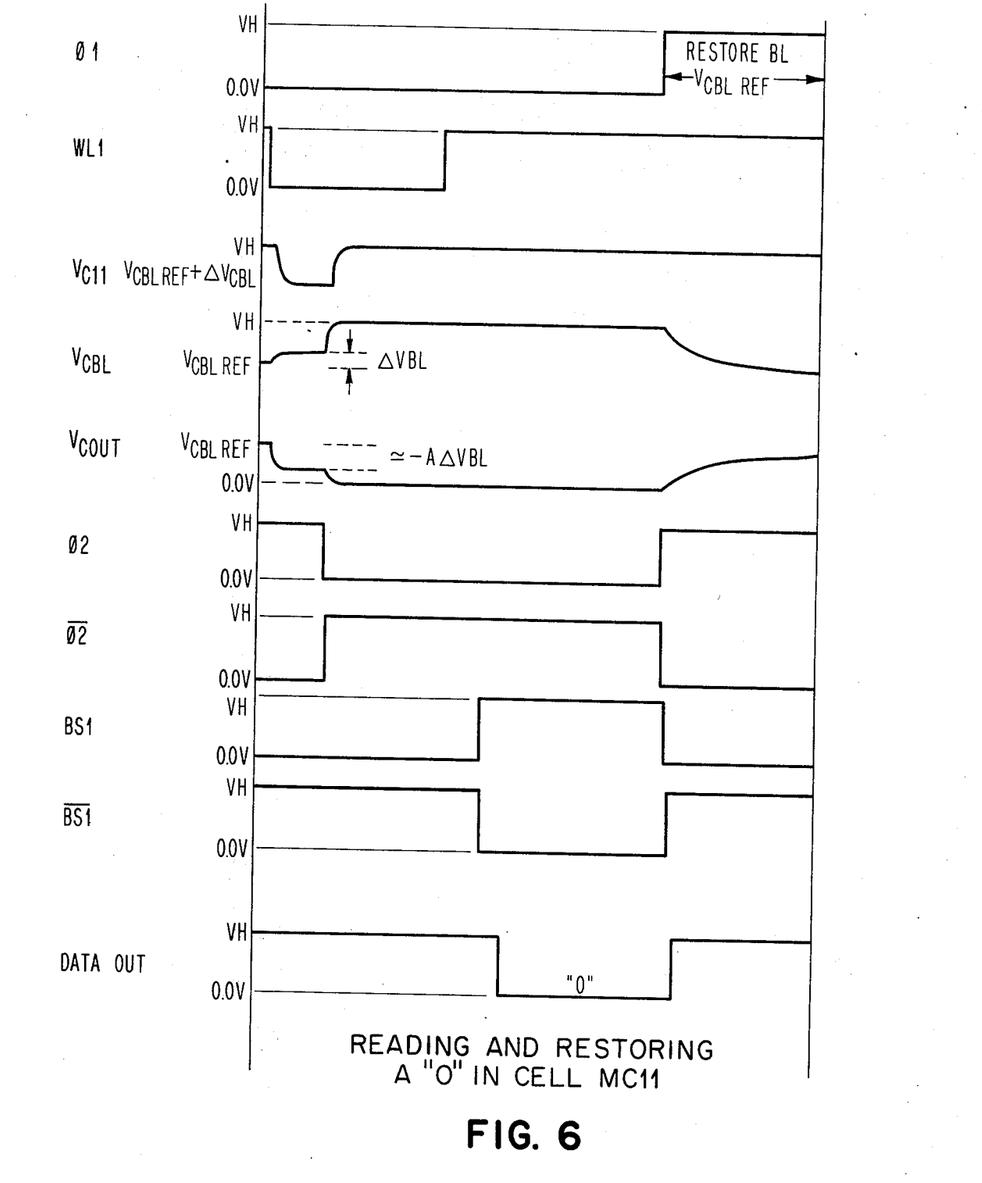
FIG. 6, when viewed in conjunction with FIGS. 1 and 2 placed together as shown in FIG. 3, depicts idealized representative waveforms for reading and restoring a binary 0 in memory cell MC11.

The operation of the preferred embodiment of the preferred embodiment of the invention will not be described making reference to the drawing and in particular FIGS. 1, 5 and 6 thereof.

READING AND RESTORING A BINARY "ONE" FROM MEMORY CELL MC11.

REFERENCE IS MADE TO THE IDEALIZED REPRESENTATIVE WAVEFORMS DEPICTED IN FIG. 5.

Assume the following initial conditions:
  a. Word Line WL1 is at the potential VH, where VH is in the order of +5 volts.
  b. $\phi 2$ is at the potential VH.
  c. $\overline{\phi 2}$ is at ground potential.
  d. $\phi 1$ is at VH potential.
  e. V$_{C11}$ ≃ V$_{TP}$ (where V$_{TP}$ is the threshold voltage of P-channel device of memory cell MC11).

1 $\phi 1$ is at VH potential, causes T3 to be turned on, hence devices T1 and T2 are biased on. The quiescent voltage (Nodes 1 and 2) is designed to be a value slightly less in magnitude than VH/2, but greater in magnitude than V$_{TP}$. Both V$_{CBL}$ and V$_{Cout}$ are restored to this quiescent voltage, which also places devices T1 and T2 in their high gain region.

2. $\phi 1$ goes to ground potential, T3 turns off isolating Node 1. Charge is coupled off of capacitor CBL and C$_{out}$, however, since device T1 is conductive, charge is restored to Node 2 (C$_{out}$), while the effective charge taken from Node 1 (CBL) is multiplied by the gain of the preamplifier, thereby unbalancing the latch.

3. Word Line WL1 goes to ground, turning T$_{1_1}$ of memory cell MC11 on. Since CC$_{11}$ << CBL very little charge is subtracted from the bit line. While little charge is subtracted from the bit line, it does enhance the setting of the latch (BPSL1) to the preferred state.

4. While V$_{CBL}$ < V$_{Cout}$, $\phi 2$ goes to ground potential and $\overline{\phi 2}$ goes to the potential VH. Since |V$_{TN}$|<|V$_{TP}$|, T5 turns on before T4, thus further enhancing this unbalance and further causing the latch formed by T1, T2, T4 and T5 to be set in the proper direction or state. That is, Node 1 at ground potential and Node 2 at potential VH, which in turn restores the memory cell storage node to V$_{TP}$. An electrical manifestation of a binary 1 namely a potential of VH is provided at the output (Node 2) of Bidirectional Preamplifying Sense Latch BPSL1.

5. Word Line WL1 is brought to potential VH, locking the information (binary 1) on the storage node of memory cell MC11.

6. $\phi 1$ is brought to VH potential, $\phi 2$ to potential VH, and $\overline{\phi 2}$ to ground potential thus allowing Nodes 1 and 2 to be restored to their quiescent state. (Namely, the initial conditions as recited supra).

READING AND RESTORING A BINARY "ZERO" FROM MEMORY CELL MC11.

Reference is made to the idealized representative Waveforms depicted in FIG. 6.

Assume the following initial conditions:
a. Word line WL1 is at the potential VH, where VH is in the order of +5 volts.
b. $\phi 2$ is at the potential VH.
c. $\overline{\phi 2}$ is at ground potential.
d. $\phi 1$ is at VH potential.
e. $V_{C11}$ = VH (Power supply voltage).

1. $\phi 1$ at VH potential, causes T3 to be turned on, hence devices T1 and T2 are biased on. The quiescent voltage (Nodes 1 and 2) is designed to be a value slightly less in magnitude than VH/2, but greater in magnitude than $V_{TP}$. Both $V_{CBL}$ and $V_{Cout}$ are restored to this quiescent voltage which also places devices T1 and T2 in their high gain region.

2. $\phi 1$ goes to ground potential, T3 turns off, and unbalances in the design causes $V_{CBL} \leq V_{Cout}$.

3. Word line WL1 goes to ground, turning $T_{11}$ of memory cell MC11 on. Since $V_{C11} > V_{CBL}$ sufficient charge is transferred to the bit line to cause it to go positive enough to override the previous unbalance, this $\Delta V_{BL}$ is also amplified by the amplifier T1 and T2 creating a very large differential in potential at Nodes 1 and 2. (This differential in potential is in the order of 2 volts when VH has a magnitude in the order of 4.5 volts).

4. $\phi 2$ goes to ground potential, while $\overline{\phi 2}$ goes to potential VH, since $V_{Cout} > V_{CBL}$ by in the order of 2 volts the Bidirectional Preamplifying Sense Latch formed by T1, T2, T4 and T5 is set in the proper direction or state. That is Node 1 at potential VH, and Node 2 at ground potential. An electrical manifestation of a binary 0, namely ground potential is provided at the output (Node 2) of Bidirectional Preamplifying Sense Latch BPSL1.

5. Word Line WL1 is brought to potential VH, locking the information (binary 0) on the storage node of memory cell MC11.

6. $\phi 1$ is brought to VH potential, $\phi 2$ to potential VH, and $\overline{\phi 2}$ to ground potential, thus allowing Nodes 1 and 2 to be restored to their quiescent state. (Namely, the initial conditions as recited supra).

Referring to FIGS. 2 and 3 placed together as shown in FIG. 3, and with reference to the foregoing description of the operation of the preferred embodiment, it will be apparent that a particular bit position associated with word line WL1, selected binary positions associated with word line WL1, or the bit positions constituting the complete binary word stored in the memory cells (MC11, MC21 . . . MCm1) and coupled to Word Line WL1 may be read from the memory by activating Word Line WL1 and the appropriate transmit gates (TG1, TG2 . . . TGM). Correspondingly, it will be appreciated that any particular bit position associated with a particular word line, or selected binary bit positions associated with a particular word line, or a complete binary word associated with a particular word line may be read from the memory by activating the particular Word Line for a read operation and conditioning the appropriate transmit gates.

Each of the transmit gates TG1 through TGM are identical and of a type generally known to the art. Thus, for convenience and brevity of explanation only transmit gate TG1 and its operation will be explained. Referring to FIG. 1, assume that latch BPSL1 has stored therein a binary 0. From the preceding explanation, it will be recalled that Node 2 is at ground potential. It will be apparent that when transmit gate TG1 is conditioned by $\overline{BS1}$ going to ground potential, and BS1 going to potential VH, the input/output terminal IOT of gate TG1 will go to ground potential. Namely, with the transmit gate conditioned by the appropriate potentials on the gates of devices T6 and T7 the potential at IOT is the same as the potential at Node 2 of BPSL1.

WRITE OPERATION

BINARY ONE

From the preceding explanation and description, it will be apparent that a binary one may be written into memory cell MC11 by (1) impressing a potential of VH on Input/Output terminal IOT of transmit gate TG1. (2) conditioning the transmit gate TG1, (3) setting BPSL1, and (4) activating Word Line WL1. This causes Node 2 of BPSL1 to assume the potential VH, and Node 1 of BPSL1 to go to ground potential. With Node 1 at ground potential and Word Line WL1 conditioned a binary 1 is written into MC11.

BINARY ZERO

From the preceding explanation and description, it will be apparent that a binary zero may be written into memory cell MC11 by (1) impressing a potential of ground on Input/Output terminal IOT of transmit gate TG1 (2) conditioning the transmit gate TG1 (3) setting BPSL1, and (4) activating Word Line WL1. This causes Node 2 of BPSL1 to assume ground potential and Node 1 of BPSL1 to go the potential VH. With Node 1 at potential VH and Word Line WL1 conditioned a binary 0 is written into MC11.

From the above explanation and description, it will be readily apparent to persons skilled in the art that the improved random access memory in accordance with the invention may be addressed by binary bit position, or by binary word address, for writing information into the memory and for reading and restoring information in the memory. Also, as is now deemed to be fully apparent to persons skilled in the art, the Bidirectional Preamplifying Sense Latch having a preferred state is not an absolute requirement. By, for example, employing a higher supply voltage, this requirement may be obviated in the practice of the invention. Thus, applicant's invention is not to be construed as limited to the preferred embodiment. Numerous modifications may be made, as will be apparent to persons skilled in the art without departing from the spirit or scope of the invention.

While the invention has been described and shown particularly with reference to one of its preferred embodiments, it will be understood by those skilled in the art to which the word is directed that various changes in form and in detail may be made without departing from either the spirit or scope of the invention.

What is claimed is:

1. In a monolithic memory having a plurality of groups of storage cells, each storage cell of each group being adapted to store an electrical manifestation of a binary 1, or an electrical manifestation of a binary 0, a preamplifying sense latch for each of said groups of storage cells for controllably sensing the binary value 0 or 1 stored in any one of said storage cells included within the group of storage cells with which said preamplifying sense latch is associated, each of said preamplifying sense latches comprising:

a first input/output terminal, a second input/output terminal, a first field effect transistor directly connected to each cell of the group of said storage cells associated with said sense latch, said first field effect transistor being directly connected between said first input/output terminal and said second input/output terminal, second, third, fourth and fifth field effect transistors respectively connected to said first field effect transistor and to each of the other ones of said second, third, fourth and fifth effect transistors, control means for controlling the conductivity of said first, second, third, fourth and fifth field effect transistors on a selective basis, further means cooperating with said control means for selectively conditioning a predetermined memory cell in the group associated with said sense latch, whereby a binary 1 or a binary 0 may be written into, or read/restored from said predetermined memory cell of each said group of said monolithic memory.

2. In a monolithic memory as recited in claim 1 wherein each storage cell consists essentially of a single field effect transistor.

3. In a monolithic memory as recited in claim 2, wherein said single field effect transistor of said memory cell is of a first conductivity type, said single field effect transistor of said memory cell includes an enhancement capacitor possessing a non-linear voltage-capacitance characteristic; and where at least one of said first, second, third, fourth and fifth transistors of said preamplifying sense latch is of a second conductivity type, opposite to said first conductivity type.

4. In a monolithic memory as recited in claim 3, wherein said second and fourth field effect transistors of each of said preamplifying sense latches are respectively of said first conductivity type and said first, third and fifth field effect transistors of each of said preamplifying sense latches are respectively of a second conductivity type opposite to said first conductivity type.

5. In a monolithic memory as recited in claim 4, wherein said second and fourth field effect transistors of each of said preamplifying sense latches is a P-channel enhancement mode field effect transistor and said first, third and fifth field effect transistors of each of said preamplifying sense latches is an N-channel enhancement mode field effect transistor.

6. In a monolithic memory as recited in claim 5 wherein:

each of said first, second, third, fourth and fifth field effect transistors of each of said preamplifying sense latches has a first terminal, a second terminal and a gate electrode;

first passive means connecting said first terminal of said second field effect transistor to a substantially constant first potential source having a first positive potential;

second passive means connecting said first terminal of said third field effect transistor to a substantially constant second potential source having a second potential;

said second potential being less positive in magnitude than said first positive potential;

third passive means connecting said first terminal of said fourth field effect transistor to a first variable potential source;

fourth passive means connecting said first terminal of said fifth field effect transistor to a second variable potential source;

fifth passive circuit means connecting said gate electrode of said first field effect transistor to a third variable potential source, where the potentials of said first, second and third variable potential sources respectively vary in timed relationship between said first substantially constant potential and said second substantially constant potential;

sixth passive circuit means connecting in common said first input/output terminal of said preamplifying sense latch, each memory cell of the group of memory cells associated with said preamplifying sense latch;

said second terminal of said fourth field effect transistor, said second terminal of said fifth field effect transistor, said first terminal of said first field effect transistor, said gate electrode of said second field effect transistor, and said gate electrode of said third field effect transistor; and seventh passive circuit means connecting in common said second input/output terminal of said preamplifying sense latch, said second terminal of said second field effect transistor, said second terminal of said third field effect transistor, said second terminal of said first field effect transistor, said gate electrode of said fourth field effect transistor and said gate electrode of said fifth field effect transistor.

7. In a monolithic memory as recited in claim 6 wherein a common output bus is provided, and wherein said second input/output terminal of each of said preamplifying sense latches is connected to said output bus via a discrete bidirectional transmit gate.

8. In a monolithic memory as recited in claim 7 wherein each bidirectional transmit gate consists essentially of a P-channel enhancement mode field effect transistor and an N-channel enhancement mode field effect transistor connected in parallel, with the potentials respectively impressed on the gates of said P-channel and N-channel field effect transistors of each said transmit gate controlling the conductivity of the transmit gate.

9. In a monolithic memory, a plurality of memory cells, wherein each memory cell forms an integral portion of the monolithic memory and consists essentially of a single P-channel enhancement mode field effect type structure, each structure comprising:

a portion of an N− substrate;

a first P+ region lying on and within said portion of said substrate;

a second P+ region lying on and within said portion of said substrate, said second P+ region being displaced in space from said first P+ region;

a first metallic electrode capacitively coupled to at least a portion of said substrate lying between said first and second P+ regions; and a second metallic electrode capacitively coupled to said substrate, said second electrode being adjacently spaced to said second P+ region and remotely spaced from said first P+ region and said first metallic electrode.

10. In a monolithic memory having a plurality of memory cells, each memory cell being adapted to store an electrical manifestation of a binary 1, or an electrical manifestation of a binary 0, said memory comprising:
one through $m$ groups of memory cells, each of said groups containing one through $n$ memory cells, where $n$ and $m$ are respectively integer numbers in the range of or equal to or greater than one and equal to or less than 256;
each of said $n \times m$ memory cells consisting essentially of a P-channel enhancement mode field effect transistor type structure including structure for functioning as an enhancement capacitor,
each of said cells having a first terminal, a second terminal and a gate electrode;
$n$ word lines, each of said $n$ word lines connected to the gate electrode of a discrete one of said $n$ field effect transistor type structures of each of said $m$ groups of memory cells;
$m$ bit sense lines, each of said $m$ bit sense lines being connected to the first terminal of each of the $n$ field effect transistor type structure of a discrete one of said $m$ groups of memory cells;
connection means connecting each of said second terminals of said $n \times m$ memory cells to a common source of reference potential;
$m$ bidirectional preamplifying sense latches, each of said bidirectional sense latches having a first node and a second node, each of said bidirectional preamplifying sense latches including first, second, third, fourth and fifth field effect transistors;
said first field effect transistor being directly connected between said second node and a source of reference potential other than said common source of reference potential, said gate electrode of said first field effect transistor being directly connected to said first node;
said second field effect transistor being directly connected between said second node and said common source of reference potential, said gate electrode of said second field effect transistor being directly connected to said first node;
said third field effect transistor being directly connected between said first node and said second node, said gate electrode of said third field effect transistor being directly connected to a first variable potential source;
said fourth field effect transistor being directly connected between a second variable potential source and said first node, said gate electrode of said fourth field effect transistor being directly connected to said second node;
said fifth field transistor being directly connected between a third variable potential source and said first node, said gate electrode of said fifth field effect transistor being directly connected to said second node; and
means connecting each of said $m$ bit lines to said first node of a discrete one of said $m$ bidirectional preamplifying sense latches.

11. In a monolithic memory as recited in claim 10, wherein $m$ bidirectional transmit gates are provided, each of said bidirectional transmit gates including:
a first input/output terminal and a second input/output terminal;
first effect transistor means interconnecting said first input/output terminal and said second input/output terminal, and controlling the conductivity of said bidirectional gate;
and means connecting said first input/output terminal of each of said $m$ bidirectional transmit gates to the second node of a discrete one of said m bidirectional preamplifying sense latches.

12. In a monolithic memory as recited in claim 11 wherein a common output bus is provided, and each of said second input/output terminals of said $m$ bidirectional transmit gates is connected to said output bus.

* * * * *